United States Patent
English et al.

(10) Patent No.: US 9,467,112 B2
(45) Date of Patent: Oct. 11, 2016

(54) HYBRID THYRISTOR-CONTROLLED SERIES CAPACITOR AND PASSIVE DAMPING FILTER FOR SERIES CAPACITORS

(71) Applicant: GE Energy Power Conversion Technology Ltd, Warwickshire (GB)

(72) Inventors: Bruce Edward English, Schenectady, NY (US); Paul E. Marken, Columbia City, IN (US)

(73) Assignee: GE ENERGY POWER CONVERSION TECHNOLOGY LTD, Rugby, Warwickshire (GB)

( * ) Notice: Subject to any disclaimer, the term of this patent is extended or adjusted under 35 U.S.C. 154(b) by 206 days.

(21) Appl. No.: 14/340,891

(22) Filed: Jul. 25, 2014

(65) Prior Publication Data

US 2016/0028360 A1    Jan. 28, 2016

(51) Int. Cl.
| | |
|---|---|
| *G05F 5/00* | (2006.01) |
| *H03H 7/01* | (2006.01) |
| *H02J 3/18* | (2006.01) |
| *G05F 3/16* | (2006.01) |
| *H02J 3/24* | (2006.01) |

(52) U.S. Cl.
CPC ............. *H03H 7/0138* (2013.01); *G05F 3/16* (2013.01); *H02J 3/1807* (2013.01); *H02J 3/24* (2013.01); *Y02E 40/14* (2013.01); *Y02E 40/30* (2013.01)

(58) Field of Classification Search
CPC .......... H02M 1/12; H02M 1/14; H02M 1/15; H02M 1/092; H02M 7/1557; G05F 1/70; Y02E 40/30; Y02E 40/12; H02H 9/08; H02J 3/01

USPC ................ 363/39–40, 45–46, 47–48, 54, 85; 323/205, 208–209, 210, 211; 307/102, 307/105

See application file for complete search history.

(56) References Cited

U.S. PATENT DOCUMENTS

| | | | |
|---|---|---|---|
| 3,731,183 A | * | 5/1973 | Johnson .................. G05F 1/455 307/104 |
| 4,384,246 A | | 5/1983 | Larsen et al. |
| 5,032,738 A | | 7/1991 | Vithayathil |
| 5,202,583 A | | 4/1993 | Larsen et al. |

(Continued)

FOREIGN PATENT DOCUMENTS

| | | |
|---|---|---|
| CN | 103050976 A | 4/2013 |
| CN | 103124077 A | 5/2013 |
| CN | 103683307 A | 3/2014 |

OTHER PUBLICATIONS

Baker et al.,"Subsynchronous Resonance Studies and Mitigation Methods for Series Capacitor Applications", Power Engineering Society Inaugural Conference and Exposition in Africa, 2005 IEEE, pp. 386-392, Jul. 11-15, 2005.

(Continued)

*Primary Examiner* — Nguyen Tran
(74) *Attorney, Agent, or Firm* — GE Global Patent Operation; Catherine J. Toppin

(57) ABSTRACT

Provided is a series capacitor for controlling a flow of power on a transmission line, and includes a filter circuit, and a thyristor-controlled circuit, wherein an interconnection and operation of the filter circuit and the thyristor-controlled circuit are performed based on a coordination of control thereof, to connect to a series capacitor bank on a transmission line.

16 Claims, 7 Drawing Sheets

(56) References Cited

U.S. PATENT DOCUMENTS

| | | |
|---|---|---|
| 5,227,713 A | 7/1993 | Bowler et al. |
| 5,384,528 A | 1/1995 | Leowald et al. |
| 5,489,838 A * | 2/1996 | Leowald ............... H02J 3/1807 323/209 |
| 5,864,185 A | 1/1999 | Neugebauer et al. |
| 6,404,656 B1 | 6/2002 | Jonsson et al. |
| 7,309,973 B2 * | 12/2007 | Garza .................... H02P 25/16 318/438 |
| 8,063,515 B2 | 11/2011 | Larsen et al. |
| 2010/0133915 A1 | 6/2010 | Asplund et al. |

OTHER PUBLICATIONS

Zheng et al., "A supplementary damping controller of TCSC for mitigating SSR", Power & Energy Society General Meeting, 2009. PES '09. IEEE, pp. 1-5, Jul. 26-30, 2009.

European Search Report and Opinion issued in connection with corresponding EP Application No. 15177214.2 on Jan. 28, 2016.

* cited by examiner

HYBRID THYRISTOR-CONTROLLED SERIES CAPACITOR AND PASSIVE DAMPING FILTER FOR SERIES CAPACITORS

I. TECHNICAL FIELD

The technical field relates generally to series capacitors.

II. BACKGROUND

To increase the power flow capacity on transmission lines within an electric power system, a series capacitor bank may be connected in series with the transmission lines. The series capacitor bank may have negative interactions with other components within the power system connected to the transmission lines.

The other components may include torsional systems of power generators, and the incorporation of a series capacitor bank may destabilize the torsional systems of the power generators, thereby causing high-magnitude, short-duration transient torques (also known as "transient torque amplification") and/or unstable/growing oscillatory torques (also known as "sub-synchronous resonance" or SSR) which can cause damage to the mechanical torsional systems (shafts, couplings, bearings) of power generators.

The series capacitors can also interact with electrical and/or control-system components, causing electrical instability (also known as "sub-synchronous control interaction" or SSCI), e.g., high-magnitude current flows and voltage swings, thereby damaging any of the electrical components within the path of that interaction.

Further, power swing oscillation may occur when two strong power systems are connected through a weak transmission connection such that if a large disturbance occurs e.g., a fault, the two strong power systems may exchange large amounts of real and reactive power in low-frequency oscillations that can be high-magnitude and/or unstable/growing, thereby causing large current and voltage swings which can damage any of the electrical components within the path of that power swing oscillation.

Two devices have been used in the past to damp out, restrict, or eliminate some or all of the above-mentioned types of oscillations which are damaging to the power systems. These two devices are known as a passive damping filter and a thyristor-controlled series capacitor (TCSC). FIG. 1 is a schematic of a conventional series capacitor including a passive damping filter circuit, and FIG. 2 is a schematic illustration of a conventional TCSC.

In FIG. 1, a main capacitor bank 110 is in series connection with the transmission line 100 and a damping filter circuit 120 is placed in parallel with the main capacitor bank 110, and includes a filter resistor 122, a filter capacitor 124 and inductor filter reactor 126. The filter resistor 122 damps the sub-synchronous series resonance caused by the main capacitor bank 110. The filter capacitor 124 and the filter reactor 126 are connected in parallel, and in series with the resistor 122.

The capacitor 124 and the filter reactor 126 block current in resistor 122 at the synchronous frequency in order to minimize steady-state conduction and thus power dissipation in the resistor 122. When there are sub-synchronous currents, i.e. currents whose frequency is less than power frequency, flowing through the transmission line, the sub-synchronous portion of currents will be diverted away from the main capacitor 110 and filter capacitor 124.

Instead, the sub-synchronous portion of currents will be directed towards the filter resistor 122 and filter reactor 126 path, providing broad resistive damping to increase electrical and torsional stability. This redirection also provides a resistive path for stored energy in the main capacitor 110 to dissipate without causing high transient torques across the electrical air gap of a power generator. This circuit does not affect or otherwise mitigate the phenomenon of power oscillation damping.

In FIG. 2, the conventional TCSC includes a main capacitor 210 is in series connection with a transmission line 200, and a thyristor-controlled reactor circuit 220 that includes a thyristor valve reactor 220 serially connected with a thyristor valve 230 having a pair of anti-parallel connected thyristors which operate as a switching device. The thyristor valve 230 is used to control the conduction duration of the thyristor valve reactor 220 and thereby control, within a range, the effective series reactance of the TCSC bank.

A continuous control of TCSC reactance is also known as Vernier operation and may, depending on the specific controls used, act to provide positive/stabilizing damping on the torsional, electrical, and power oscillation stability issues mentioned before. Active control of a conventional TCSC is performed by a controller with many possible functions. This multiplicity of functionality may cause short periods of time when conflicting control commands lead to a prioritization and a selection of a control mode that is beneficial for one function and detrimental to another.

For example, the function of power oscillation damping may cause the thyristor valve therein to block conduction entirely, and when blocked, it creates an open circuit leaving the main capacitor 210 as a simple fixed series capacitor bank, and is therefore not performing the SSR mitigation function. Because of this and other issues, the conventional TCSC cannot be relied upon to mitigate the phenomenon of transient torque amplification.

Another issue associated with the TCSC, is that in order to perform certain mitigations effectively, the thyristor valve therein is in continuous Vernier operation which requires the TCSC components e.g., the thyristor valve reactor 222 and the thyristor valve 224 to be rated for steady state current, and while conducting in a steady state, the thyristor valve generates heat and in order to remove the heat and avoid damage to the thyristor components, deionized water is passed through a heat exchanger to pump the deionized water up to the high voltages of transmission lines, which can range from 138 kV to as high as 1000 kV.

Since the capacitor banks are connected in series with the high voltage transmission lines, the deionized water needs to be pumped to a high voltage comparable to the high voltage on the transmission lines.

These two types of conventional series capacitors, with passive damping filter circuits 120 or TCSC components, are used for various transmission system functions including, for example, sub-synchronous resonance (SSR, torsional stability) mitigation, sub-synchronous control interaction (SSCI, electrical stability) mitigation, transient torque amplification mitigation, power swing oscillation damping, and power flow control.

III. SUMMARY OF THE EMBODIMENTS

The various embodiments of the present disclosure are configured to mitigate the disadvantages of the above-mentioned series capacitors by providing a hybrid TCSC and passive damping filter circuit of a series capacitor that coordinates the application of both technologies for improved SSR mitigation performance during a steady state and a transient state, and facilitates power oscillation damping.

The hybrid TCSC and passive damping filter circuit is employed in either a parallel connection or a series connection, across one or more series capacitor banks. An optional filter switch is provided and configured to selectively control operation of the passive damping filter within the circuit.

In one exemplary embodiment, a series capacitor is provided for controlling flow of power over a transmission line, and includes a filter circuit; and a thyristor-controlled circuit, wherein an interconnection and operation of the filter circuit and the thyristor-controlled circuit are performed based on a coordination of control thereof, to connect to a series capacitor bank on a transmission line.

In another exemplary embodiment, a method of performing an operation of a hybrid thyristor-controlled series capacitor (TCSC) and passive damping filter circuit is provided. The method includes controlling an interconnection and operation of a filter circuit and a thyristor-controlled circuit of the TCSC and passive damping filter circuit, based on a coordination of control, to connect to a series capacitor bank.

The foregoing has broadly outlined some of the aspects and features of various embodiments, which should be construed to be merely illustrative of various potential applications of the disclosure. Other beneficial results can be obtained by applying the disclosed information in a different manner or by combining various aspects of the disclosed embodiments. Accordingly, other aspects and a more comprehensive understanding may be obtained by referring to the detailed description of the exemplary embodiments taken in conjunction with the accompanying drawings, in addition to the scope defined by the claims.

IV. DESCRIPTION OF THE DRAWINGS

Figure 1:
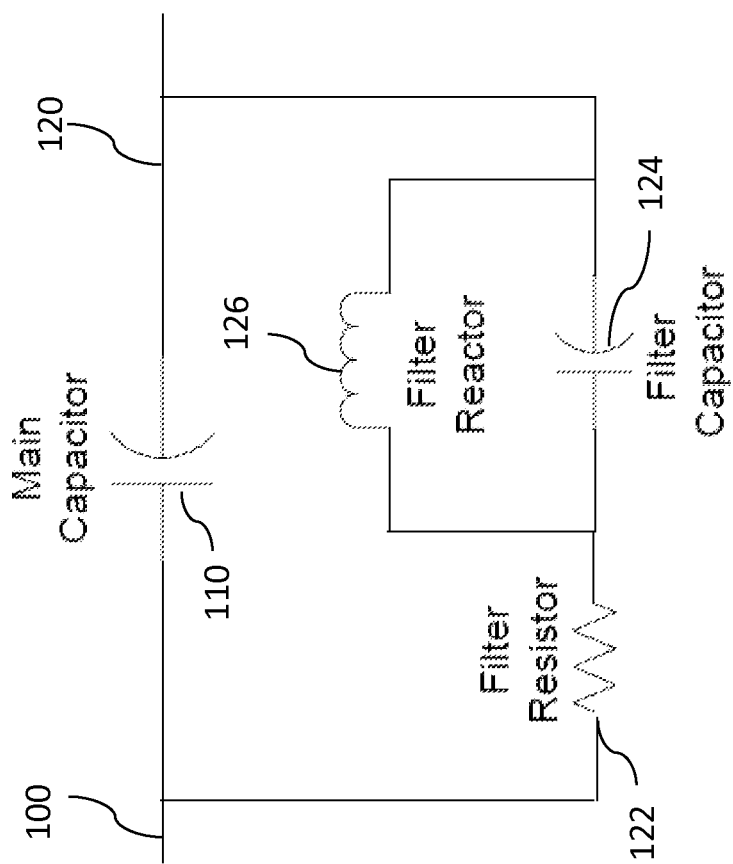
FIG. 1 is a schematic of a conventional series capacitor including a damping filter.
Figure 2:
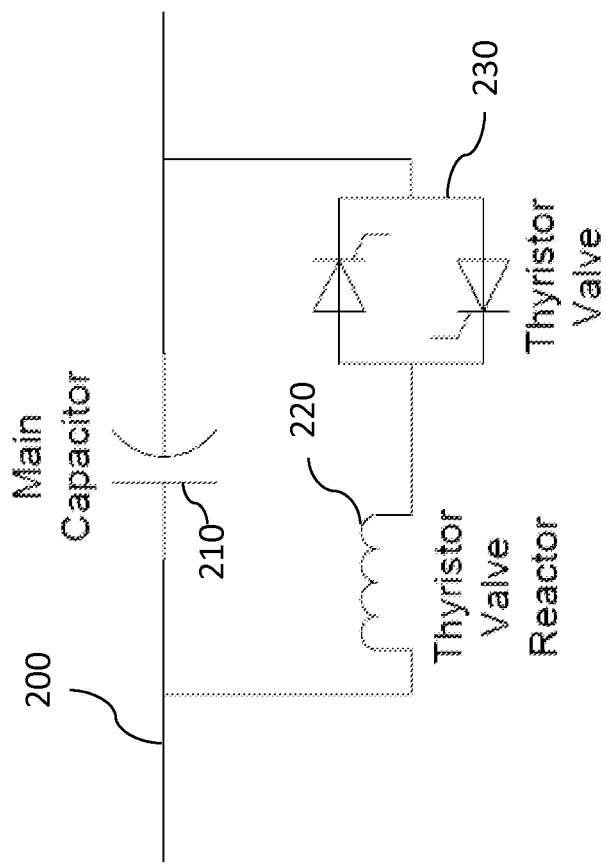
FIG. 2 is a schematic illustration of a conventional TCSC.

The drawings are only for purposes of illustrating preferred embodiments and are not to be construed as limiting the disclosure. Given the following enabling description of the drawings, the novel aspects of the present disclosure should become evident to a person of ordinary skill in the art. This detailed description uses numerical and letter designations to refer to features in the drawings. Like or similar designations in the drawings and description have been used to refer to like or similar parts of embodiments of the invention.

V. DETAILED DESCRIPTION OF THE EMBODIMENTS

As required, detailed embodiments are disclosed herein. It must be understood that the disclosed embodiments are merely exemplary of various and alternative forms. As used herein, the word "exemplary" is used expansively to refer to embodiments that serve as illustrations, specimens, models, or patterns.

The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 3:
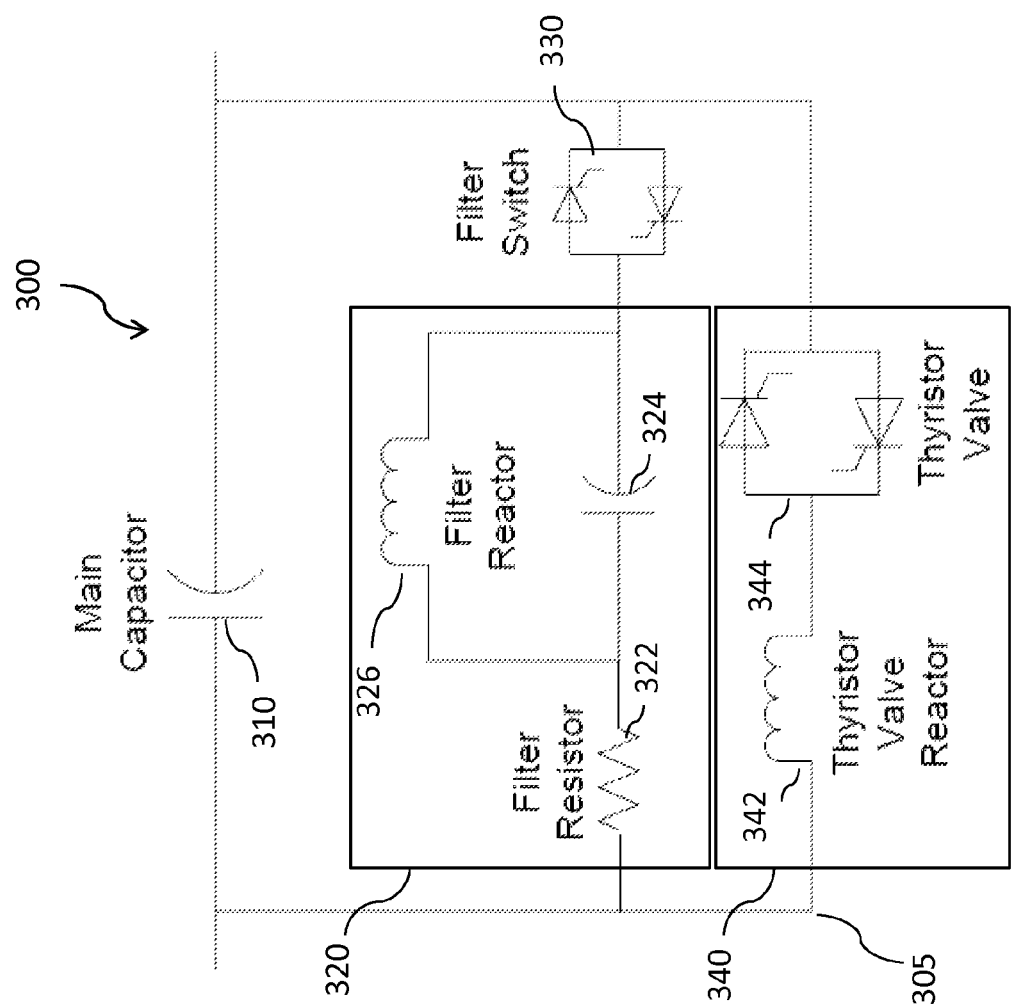
FIG. 3 is a schematic illustration of a hybrid TCSC and passive damping filter circuit of a series capacitor, in a parallel connection, and including an optional filter switch according to one or more exemplary embodiments.

FIG. 3 is a schematic illustration of a hybrid TCSC and passive damping filter circuit 300 of a series capacitor in parallel connection, and including an optional filter switch. The hybrid TCSC and passive damping filter circuit 300 is configured to perform simultaneously to improve transmission of power by power generation sources connected to transmission lines of the hybrid TCSC and passive damping filter circuit 300.

The hybrid TCSC and damping filter circuit 300 comprises a main capacitor bank 310 in series connection with a transmission line 305 and in parallel connection with a passive damping filter circuit 320, an optional filter switch 330, and a thyristor-controlled circuit 340.

The hybrid TCSC and passive damping filter circuit 300 is configured to control interconnection and operation of the passive damping filter circuit 320 and the thyristor-controlled circuit 340, based on a coordination of control, to connect to the main capacitor bank 310 in series with the transmission line 305. In one example, the filter switch 330 may be in an opened state, therefore preventing the passive damping filter circuit 320 from being included within the hybrid TCSC and passive damping filter circuit 300. On the other hand, when the filter switch 330 is in a closed state the passive damping filter 320 is inserted into the circuit 300.

The passive damping filter circuit 320 comprises a filter resistor 322 in series connection with a parallel-connected filter capacitor 324 and a filter reactor 326. The filter resistor 322 is configured to damp sub-synchronous series resonance caused by the main capacitor bank 310. Current conduction through the filter resistor 322 may be measured, and this measurement used to inform and coordinate the control a thyristor valve 344 of the thyristor-controlled circuit 340.

According to one or more embodiments, the optional filter switch 330 includes a breaker or other power electronic device. The filter switch 330 is in series connection with the passive damping filter circuit 320 and the series-connected passive damping filter circuit 320 plus filter switch 330 is in parallel connection with both the thyristor-controlled circuit 340 and the series capacitor bank 310.

The optional filter switch 330 is configured to selectively control the damping filter circuit 320 to be inserted or removed from the hybrid TCSC and passive damping filter circuit 300 as needed. For example, when the thyristor valve 344 is blocked, the filter switch 330 may be switched to insert the passive damping filter circuit 320 for operation thereof.

According to one or more embodiments, the parallel connection between the damping filter circuit 320 and the thyristor-controlled circuit 340 enables mitigation of a DC trapped charges on the series capacitor bank 310, and provides parallel surge impedance, surge protection and maximum voltage mitigation. This mitigation is in addition to, and complementary of, the transient overvoltage protection provided by a metal oxide varistor (not shown) in parallel with the main capacitor bank 310.

The filter switch 330 further enables switching of the passive damping filter circuit 320 in and out of the hybrid TCSC and passive damping filter circuit, to use only as needed, thereby minimizing damage to components of the passive damping filter circuit 320, and reducing power losses that might occur in the filter resistor 322 and the filter reactor 326.

The thyristor-controlled circuit 340 comprises a thyristor valve reactor 342 and a thyristor valve 344. The passive damping filter circuit 320 enables the thyristor valve 344 of the thyristor-controlled circuit 340 to be temporarily blocked or to run at lower vernier operations in the steady state, such that a blocking signal transmitted to the thyristor valve 344 is also transmitted simultaneously to close the filter switch 330, and insert the passive damping filter circuit 320, to thereby operate the damping filter circuit 320 while the thyristor valve 344 is blocked.

Also, monitoring of the current at the damping filter circuit 320 with an appropriate algorithm, e.g. analyzing the magnitude of sub-synchronous currents flowing through the filter resistor 322, can be used to change the vernier operation level of the thyristor valve 344 to damp out certain transients. The hybrid TCSC and passive damping filter circuit therefore operates in both the steady state and transient states.

The switching of the passive damping filter circuit 320 via the filter switch 330 and/or a lower-current rating for the steady-state vernier operation, allows the use of lower ratings for one or both of the damping filter circuit 320 and the thyristor-controlled circuit 340, thereby eliminating the need for a cooling process of the power electronics within the thyristor-controlled circuit 340. Also, the operation of the passive damping filter circuit 320, while the thyristor valve 344 is blocked can mitigate transient torque amplification through the fast discharging of stored energy of the main capacitor bank 310 during transients that would otherwise cause transient torque amplification for one or more power system generators.

According to one or more embodiments, the thyristor valve 344 comprises a pair of anti-parallel connected thyristors. According to alternative embodiments, the thyristors may be replaced with IGBT's, other power electronics devices, or other fast-switching devices capable of the same or similar functionality as is performed by the thyristors in this application.

According to one or more embodiments, the transmission line 305 may be configured as 3-phase lines, and the damping filter circuit is placed on one, two or three phases. The passive components of the passive damping filter circuit 320 may also be configured in various ways.

For example, in some embodiments the filter resistor 322 is connected in series to the filter capacitor 324 and filter reactor 326 however according to other embodiments, the filter resistor 322 is replaced by a resistor connected in series with an inductor, a resistor connected in series with an inductor and capacitor, and a resistor connected in parallel with a series connected inductor and capacitor, and other suitable configuration as desired. The damping filter circuit 320 may also be configured to include a parallel connected resistor, inductor and capacitor. Any suitable circuit configurations may be employed herein.

According to other embodiments, the optional filter switch 330 may be configured to switch the damping filter circuit 320 to be in operation within the hybrid TCSC and passive damping filter circuit. Alternatively, two or more damping filter circuits may be provided therein, and may be connected in parallel, but isolated via one or more filter switches.

Further, two or more damping filter circuits may be operated as a primary damping filter circuit and a secondary damping filter circuit, where upon failure of the primary damping filter circuit, the secondary damping filter circuit functions as a backup filter to the primary damping circuit.

According to one or more embodiments, the passive damping filter circuit may be more suited for mitigating SSRs at certain frequency ranges e.g., from 5 Hz to 25 Hz in a 60 Hz power system, while the thyristor-controlled circuit is suited for mitigating SSRs at other frequency ranges e.g., from 20 Hz to 55 Hz in that same 60 Hz power system, such that the combination of mitigation strategies covers the entirety of the sub-synchronous frequency range in an optimal manner.

Figure 4:
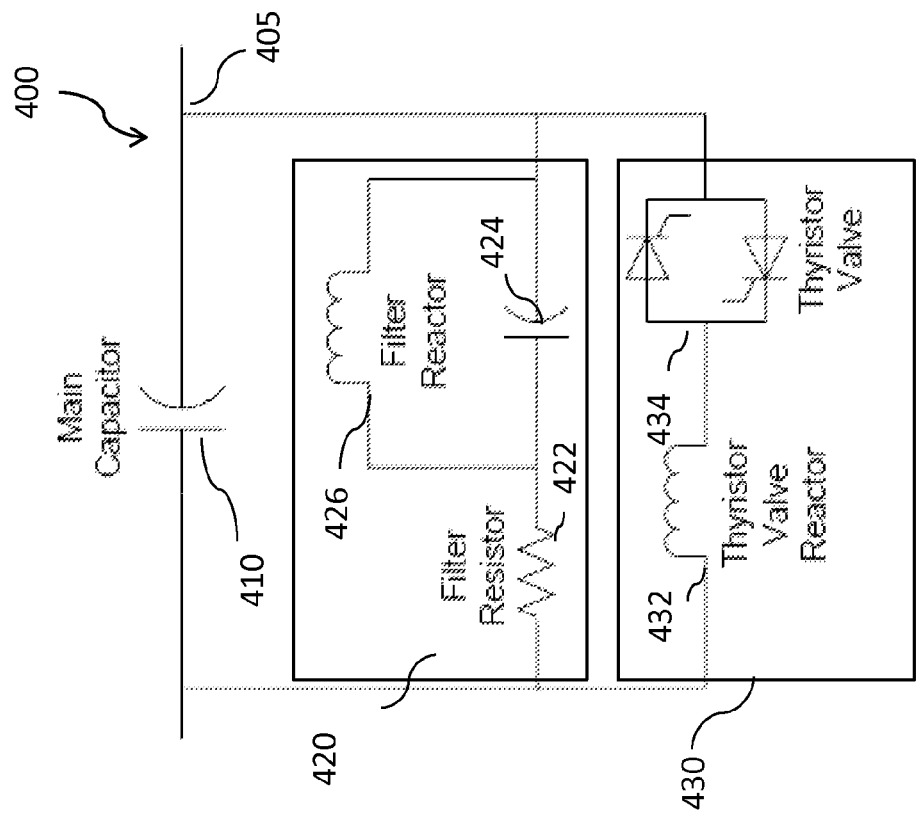
FIG. 4 is a schematic illustration of a hybrid TCSC and passive damping filter circuit of a series capacitor, in a parallel connection, excluding a filter switch according to one or more exemplary embodiments.

FIG. 4 is a schematic illustration of a hybrid TCSC and passive damping filter circuit 400 in a parallel connection for a series capacitor on a transmission line 405, excluding a filter switch according to one or more exemplary embodiments. The hybrid TCSC and passive damping filter circuit 400 comprises a main capacitor bank 410 in series connection with a transmission line 405 and in parallel connection with both a damping filter circuit 420 and a thyristor-controlled circuit 430 including a thyristor valve reactor 432 and a thyristor valve 434.

As shown in FIG. 4, some of the components operate in a similar manner as those shown in FIG. 3, therefore a detailed description of these components has been omitted. The hybrid TCSC and passive damping filter circuit 400 as shown in FIG. 4 eliminates the need for filter switch (e.g., element 330 shown in FIG. 3) since the damping filter circuit 420 in permanently included therein. According to one or more embodiments, the filter resistor 422 is connected in series to a filter capacitor 424 and a filter reactor 426 to dissipate any DC voltage offset in the main capacitor bank 410 and assist with the operation of the thyristor valve 434 to control the conduction duration of the thyristor valve reactor 432 within the thyristor-controlled circuit 430.

Figure 5:
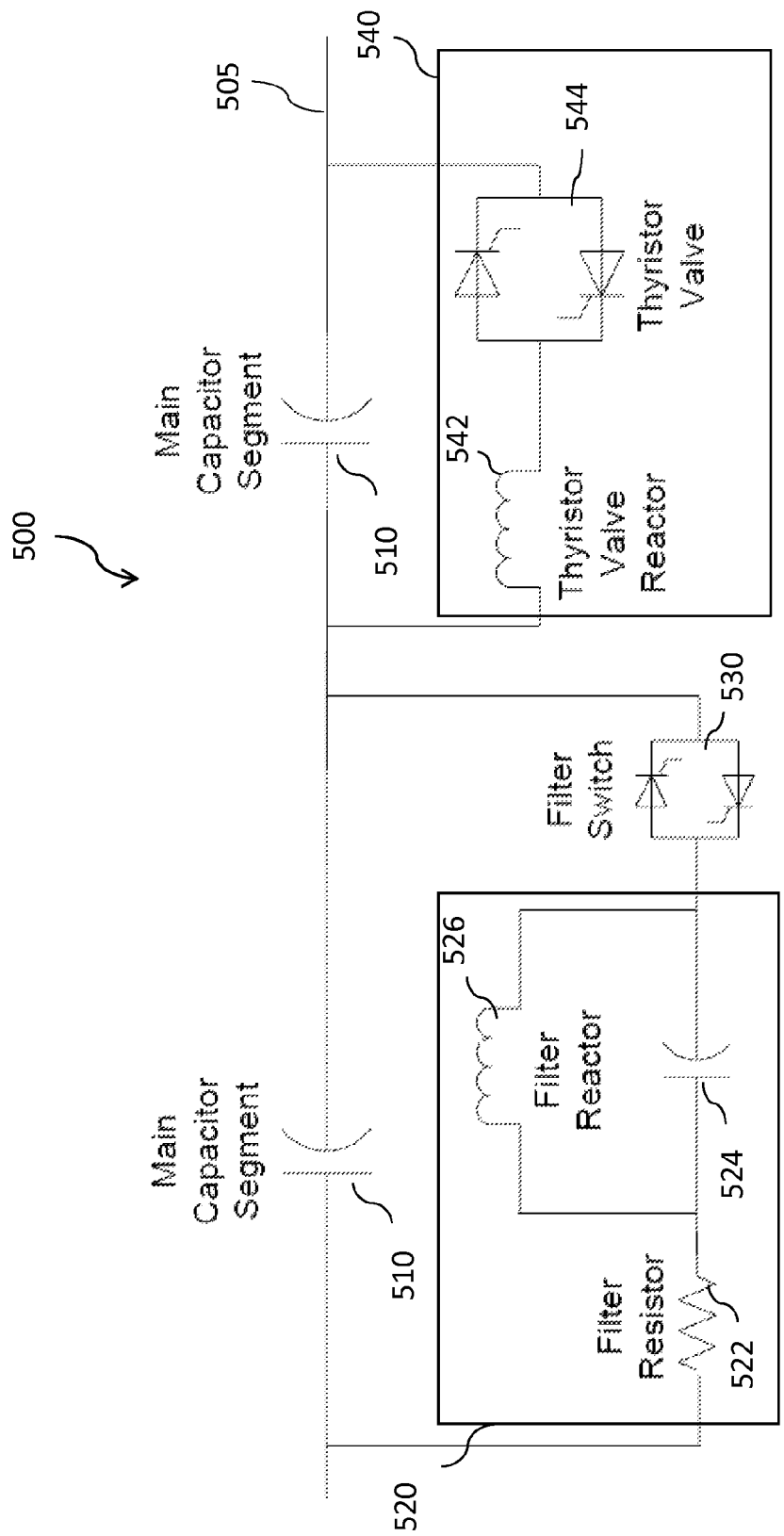
FIG. 5 is a schematic illustration of a hybrid TCSC and passive damping filter circuit of a series capacitor, in a series connection, including an optional filter switch according to one or more exemplary embodiments.

FIG. 5 is a schematic illustration of a hybrid TCSC and passive damping filter circuit 500 in a series connection for main capacitor segments 510, including an optional filter switch 530 according to one or more exemplary embodiments. The hybrid TCSC and passive damping filter circuit 500 comprises a plurality of main capacitor segments 510 in series on a transmission line 505, a filter circuit 520 including a filter resistor 522, a filter capacitor 524, and a filter reactor 526, is in series connection with a parallel-connected thyristor-controlled circuit 540 and a separate main capacitor segment 510. The thyristor-controlled circuit 540 includes a thyristors valve reactor 542 connected in series with a thyristor valve 544.

The operation of the circuit shown in FIG. 5 is similar to the circuit shown in FIG. 3. The components of FIG. 5 may not necessarily need to be located in a common location but could be separated by a distance as is convenient for the application. The controls of each circuit 520 and 540 could still be commonly controlled to from an overall system 500 that has beneficial performance for the transmission line 505.

Figure 6:
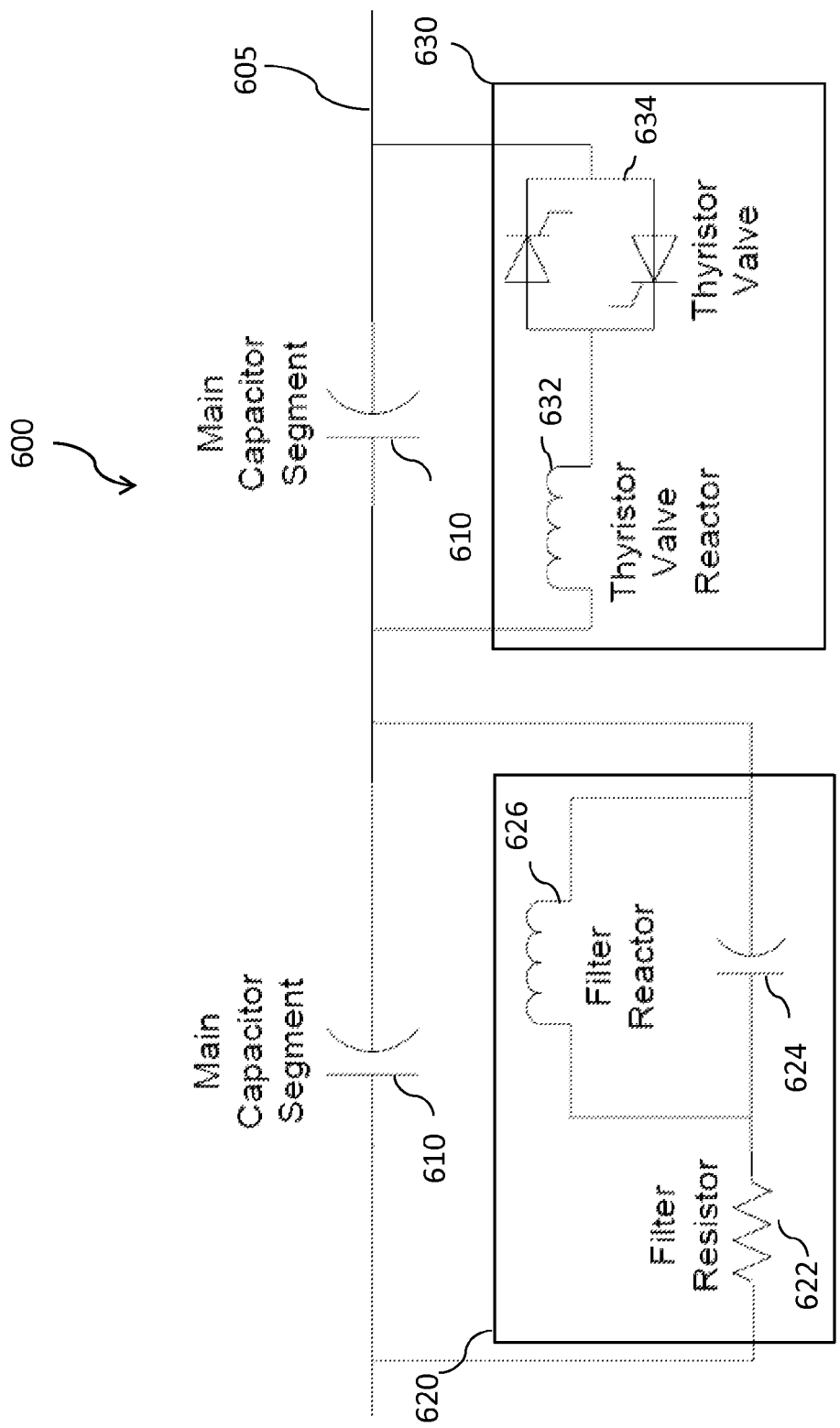
FIG. 6 is a schematic illustration of a hybrid TCSC and passive damping filter circuit of a series capacitor in a series connection, excluding a filter switch according to one or more exemplary embodiments.

FIG. 6 is a schematic illustration of a hybrid TCSC and damping filter circuit 600 in a series connection for main capacitor segments 610, excluding a filter switch according to one or more exemplary embodiments. In FIG. 6, the hybrid TCSC and passive damping filter circuit comprises a plurality of main capacitor segments 610 along a transmission line 605, a passive damping filter circuit 620 and a thyristor-controlled circuit 630.

The passive damping filter circuit 620 comprises a filter resistor 622, a filter capacitor 624 and a filter reactor 626. The thyristor-controlled circuit 630 comprises a thyristor valve reactor 632 in series with a thyristor valve 634. The operation of the passive damping filter circuit 620 and the thyristor-controlled circuit 630 may be coordinated by monitoring current through the filter resistor 622 and using the measured current value to control operation of the thyristor valve 634.

A bypass switch (not shown) may be included in parallel with the passive damping filter circuit 620 and/or the thyrsistor-controlled circuit 640, to protect the passive damping filter circuit 620 and/or the thyristor-controlled circuit 640 in case of failure or for system maintenance. The operation of the circuit shown in FIG. 6 is similar to the circuit shown in FIG. 4. Similar to FIG. 5, the components of FIG. 6 need not be commonly located.

According to other embodiments, a separate monitoring system may provide input into the thyristor valve 634 and/or filter switch operation.

Figure 7:
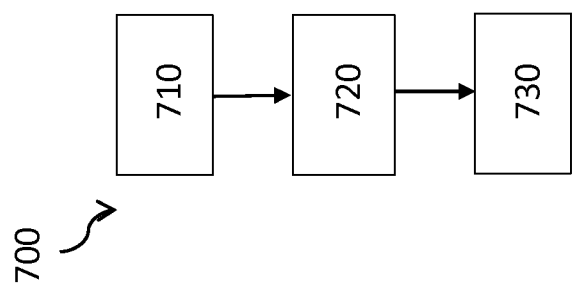
FIG. 7 is a flow diagram of an exemplary method for controlling an interconnection and operation of a hybrid TCSC and passive damping circuit.

FIG. 7 is a flow diagram of an exemplary method 700 for controlling an interconnection and operation of a hybrid TCSC and passive damping circuit in reference to FIG. 3. In step 710, the filter resistor 322 of the passive damping circuit 320 damps sub-synchronous series resonance caused by the main capacitor bank 310, and receives current from one or more power generating sources (not shown) in step 720. In step 730, the measured current through filter resistor 322 is sent to the controller of thyristor-controlled circuit 340 to coordinate the control of a thyristor valve 344 of the thyristor-controlled circuit 340.

Exemplary embodiments of the hybrid TCSC and passive damping filter circuit provide improved SSR mitigation performance during a steady state as well as during transient states, and power oscillation damping. Further, the circuit reduces manufacturing costs by minimizing the need for a cooling operation to be performed within the series capacitor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A series capacitor for controlling flow of power over a transmission line, comprising:

a filter circuit having a filter reactor and a filter capacitor in a parallel connection, and a filter resistor in series connection with the filter reactor and the filter capacitor; and a thyristor-controlled circuit, wherein an interconnection and operation of the filter circuit and the thyristor-controlled circuit are performed based on a coordination of control thereof, to connect to a series capacitor bank on a transmission line, wherein the filter resistor is configured to monitor current flowing from a power generating source connected to the transmission line, and transmit the current to coordinate operation of the thyristor-controlled circuit.

2. The series capacitor of claim 1, wherein the series capacitor further comprises:

a filter switch configured to facilitate the interconnection and the operation of the filter circuit, wherein a blocking signal is transmitted to the thyristor-controlled circuit to temporarily block the thyristor-controlled circuit, and the blocking signal is simultaneously transmitted to the filter switch to initiate operation of the filter circuit while blocking of the thyristor-controlled circuit.

3. The series capacitor of claim 1, wherein the thyristor-controlled circuit comprises:

a thyristor valve reactor; and a thyristor valve, wherein the current transmitted from the filter circuit informs firing of the thyristor valve, monitoring of a sub-synchronous component of the current and initiate operation of the thyristor valve upon exceeding a predetermined magnitude.

4. The series capacitor of claim 3, wherein monitoring of the current at the filter circuit is performed with an algorithm by analyzing a magnitude of sub-synchronous currents flowing through the filter resistor, and changing a vernier operation level of the thyristor valve to damp out transients.

5. The series capacitor of claim 1, wherein the filter circuit and the thyristor-controlled circuit as disposed in a parallel connection.

6. The series capacitor of claim 1, wherein the filter circuit and the thyristor-controlled circuit are disposed in a series connection.

7. A method of performing an operation of a hybrid thyristor-controlled series capacitor (TCSC) and passive damping filter circuit, comprising:

controlling an interconnection and operation of a filter circuit and a thyristor-controlled circuit of the TCSC and passive damping filter circuit, based on a coordination of control, to connect to a series capacitor bank; and performing the interconnection and operation of the filter circuit, by transmitting a blocking signal to the thyristor-controlled circuit to temporarily block the thyristor-controlled circuit, and simultaneously transmitting an insertion signal to a filter switch to initiate operation of the filter circuit while blocking the thyristor-controlled circuit.

8. The method of claim 7, wherein controlling the interconnection and operation of the filter circuit and the thyristor-controlled circuit of the TCSC and passive damping filter circuit comprises:

damping sub-synchronous series resonance caused by the series capacitor bank; and receiving current from one or more power generating sources and transmitting the current received to the thyristor-controlled circuit to control a thyristor valve of the thyristor-controlled circuit.

9. The method of claim 8, further comprising:
monitoring, via a filter resistor of the filter circuit, current flowing from a power generating source connected to the transmission line, and transmitting the current to coordinate the operation of the thyristor-controlled circuit.

10. The method of claim 7, further comprising:
informing of firing of a thyristor valve of the thyristor-controlled circuit, when the current is transmitted to the filter circuit;
monitoring of a sub-synchronous component of the current and coordinating the operation of the thyristor valve based on the sub-synchronous component.

11. The method of claim 10, further comprising:
monitoring of the current at the filter circuit by performing an algorithm analyzing a magnitude of sub-synchronous currents flowing through the filter resistor, and changing a vernier operation level of the thyristor valve to damp out transients, wherein initiating operation of the thyristor valve is performed upon exceeding a predetermined magnitude.

12. The method of claim 7, comprising:
forming a parallel connection between the filter circuit and the thyristor-controlled circuit.

13. The method of claim 7, comprising:
forming a series connection between the filter circuit and the thyristor-controlled circuit.

14. A series compensation circuit for controlling flow of power over a transmission line, comprising:
a filter circuit having a filter reactor and a filter capacitor in a parallel connection, and a filter resistor in series connection with the filter reactor and the filter capacitor; and
a thyristor-controlled circuit, wherein at least one of the filter circuit or the thyristor-controlled circuit connects to a series capacitor bank on a transmission line based on the coordination of control between the filter circuit and the thyristor-controlled circuit,
wherein the filter resistor is configured to monitor current flowing from a power generating source connected to the transmission line, and transmit the current to coordinate operation of the thyristor-controlled circuit.

15. The series compensation circuit of claim 14, further comprising monitoring of current at the filter circuit from a power generating source and transmitting the current to the thyristor-controlled circuit to initiate operation thereof.

16. The series compensation circuit of claim 15, wherein the filter circuit comprises:
a filter switch configured to facilitate an interconnection and operation of the filter circuit, wherein a blocking signal is transmitted to the thyristor-controlled circuit to temporarily block the thyristor-controlled circuit, and the blocking signal is simultaneously transmitted to the filter switch to initiate operation of the filter circuit while blocking the thyristor-controlled circuit.

* * * * *